United States Patent [19]
De Loe, Jr.

[11] Patent Number: 5,602,513
[45] Date of Patent: * Feb. 11, 1997

[54] REVERSED PHASE-LOCKED LOOP

[75] Inventor: John P. De Loe, Jr., Decatur, Ga.

[73] Assignee: Oki Telecom, Suwanee, Ga.

[*] Notice: The term of this patent shall not extend beyond the expiration date of Pat. No. 5,488,332.

[21] Appl. No.: 466,222

[22] Filed: Jun. 6, 1995

Related U.S. Application Data

[63] Continuation of Ser. No. 258,347, Jun. 10, 1994, Pat. No. 5,488,332.

[51] Int. Cl.$^6$ .............................. H03L 7/08; H03L 7/085
[52] U.S. Cl. ............................ 331/25; 331/1 A; 331/16; 331/17; 331/DIG. 2; 331/74; 327/105; 327/156; 327/159; 455/260
[58] Field of Search .................................. 331/25, 1 A, 4, 331/8, 14, 16, 17, 18, 74, DIG. 2, 108 C; 327/105, 156, 159; 455/260

[56] References Cited

U.S. PATENT DOCUMENTS

| | | |
|---|---|---|
| 4,048,582 | 9/1977 | Ihara .......................................... 331/16 |
| 4,862,107 | 8/1989 | Paneth ........................................ 331/2 |
| 5,140,698 | 8/1992 | Toko ........................................ 455/76 |
| 5,170,492 | 12/1992 | Moller et al. ............................ 455/76 |

OTHER PUBLICATIONS

Exar Corporation, *Databook*, Apr. 1986, pp. 1–38 to 1–52 "Precision Phase–Lockedloop/Tone Deoder" 331/25.

*Primary Examiner*—David Mis
*Attorney, Agent, or Firm*—Jeffrey R. Kuester; Thomas, Kayden, Horstemeyer & Risley

[57] ABSTRACT

A phase-locked loop (PLL) frequency synthesizer is connected in reverse to a reference signal and a controlled oscillator loop including a low pass filter and a voltage-controlled oscillator (VCO). Rather than receiving a reference signal through a reference oscillator input and a VCO output signal through a VCO input, the PLL frequency synthesizer receives a reference signal through the VCO input and receives the VCO output signal through the reference oscillator input. Additionally, the output of the PLL is taken from the buffered reference output, thereby eliminating the need for an external buffer. Accordingly, the data loaded into the PLL frequency synthesizer accommodates the reversed input scheme by altering the divide ratios and inverting the phase detector output signal. In addition, a selective grounding network is connected to the reference oscillator input of the PLL frequency synthesizer to greatly reduce power consumption of the PLL frequency synthesizer, and as part of the same effort, a voltage switch is utilized to remove power to the VCO.

25 Claims, 3 Drawing Sheets

REVERSED PHASE-LOCKED LOOP

CROSS-REFERENCE TO RELATED APPLICATION

This application is a continuation of application Ser. No. 08/258,347, filed on Jun. 10, 1994 now U.S. Pat. No. 5,488,332.

BACKGROUND OF THE INVENTION

The present invention relates generally to the field of frequency modification, and more specifically, to the field of controlling frequency synthesis in a CDMA/FM (code division multiple access/frequency modulation) dual-mode cellular telephone.

A phase-locked loop (PLL) is an electronic circuit for providing a signal with a precisely controlled frequency. One example of a typical PLL includes a PLL frequency synthesizer, a low pass filter, and a voltage-controlled oscillator (VCO). One type of prior art PLL frequency synthesizer, such as the MC145170 integrated circuit available from Motorola, includes dividing counters, configuration registers, a phase detector, a lock detector, and a reference signal buffer. Inputs and outputs include, among others, a reference oscillator input and output, a VCO input, a data input, a phase detector output, a lock detector output, and a buffered reference output. The phase detector and lock detector continuously compare signals from the dividing counters which divide signals received through the reference oscillator input and the VCO input according to data received through the data input. The voltage of the signal continuously output through the phase detector output provides an indication of the phase difference between the internal signals from the dividing counters, and the lock detector output provides an indication of when those signals are perfectly in phase with each other.

According to a conventional circuital configuration of a PLL, a low pass filter and a VCO are coupled between the phase detector output and the VCO input of the PLL frequency synthesizer. In one such configuration, a crystal oscillator is coupled across the reference oscillator input and output of the PLL frequency synthesizer. The buffered reference output provides a buffered version of the crystal oscillator reference frequency (or a division thereof) for driving additional PLL frequency synthesizers or clock inputs on other devices, thereby removing the need for additional crystals for those devices. In another configuration, such as one of the above-referenced "additional PLL frequency synthesizers", an external clock source is connected to the reference oscillator input to provide a reference frequency and replace the crystal oscillator. In each of these configurations, the signal at the VCO input of the PLL frequency synthesizer is used as the output frequency of the PLL. Through the control signal which is output through the phase detector output of the PLL frequency synthesizer, the VCO is locked to oscillate at a particular frequency with a particular phase, according to the signal received through the reference oscillator input.

One additional circuital element often used in conjunction with the output of the PLL is an external signal buffer, such as a linearly biased digital inverter, an appropriately biased transistor, etc. A buffer provides enough power to drive subsequent circuital elements without undesirably loading the VCO, isolates the VCO from noise and interference generated by subsequent circuital elements, and, depending on the type of buffer employed, provides a full square wave (digital) output. In order to provide a smaller, less expensive, and simpler design, it would be desirable to omit this extra buffer. Unfortunately, the prior art provides little assistance in this endeavor.

Additionally, in CDMA/FM dual-mode cellular telephones, as well as other multi-mode devices, it is often desirable to be able to conserve power by removing power to various elements not in use. Unfortunately, removing power to many PLL frequency synthesizers would necessitate re-loading data into the various registers of the PLL frequency synthesizer, a process which would require too much time for many applications.

There is, therefore, a need in the industry for a phase-locked loop circuit which addresses these and other related, and unrelated, problems.

SUMMARY OF THE INVENTION

Briefly described, the present invention includes, in its most preferred embodiment, a reversed PLL including a PLL frequency synthesizer, a low pass filter, and a VCO. Rather than receiving a reference signal through a reference oscillator input and a VCO output signal through a VCO input, the PLL frequency synthesizer receives a reference signal through the VCO input and receives the VCO output signal through the reference oscillator input. Additionally, the output of the PLL is taken from the buffered reference output, thereby eliminating the need for an external buffer. Accordingly, the data loaded into the PLL frequency synthesizer accommodates the reversed input scheme by altering the divide ratios and inverting the phase detector output signal.

In addition, a selective grounding network is connected to the reference oscillator input of the PLL frequency synthesizer to greatly reduce power consumption of the PLL frequency synthesizer. Furthermore, as part of the same effort, a voltage switch is utilized to remove power to the VCO.

It is therefore an object of the present invention to provide a new phase-locked loop circuit.

Another object of the present invention is to provide a reversed phase-locked loop circuit.

Yet another object of the present invention is to provide a PLL circuit including a PLL frequency synthesizer with an internal buffer receiving a voltage-controlled oscillator output.

Still another object of the present invention is to provide a PLL circuit including a PLL frequency synthesizer receiving a reference frequency through a VCO input and receiving a VCO output signal through a reference oscillator input.

Still another object of the present invention is to provide a PLL circuit including a PLL frequency synthesizer with a selective grounding network coupled to a reference oscillator input.

Still another object of the present invention is to provide a cellular telephone with a reversed PLL circuit.

Still another object of the present invention is to provide a method for generating a signal with a controlled frequency by utilizing an internal buffer of a PLL frequency synthesizer to buffer the signal with the controlled frequency.

Still another object of the present invention is to provide a PLL circuit with a PLL frequency synthesizer, a low pass loop filter, and a VCO coupled to one another in a reversed arrangement.

Other objects, features and advantages of the present invention will become apparent upon reading and understanding the present specification, when taken in conjunction with the accompanying drawings.

DETAILED DESCRIPTION OF THE PREFERRED EMBODIMENTS

Figure 1:
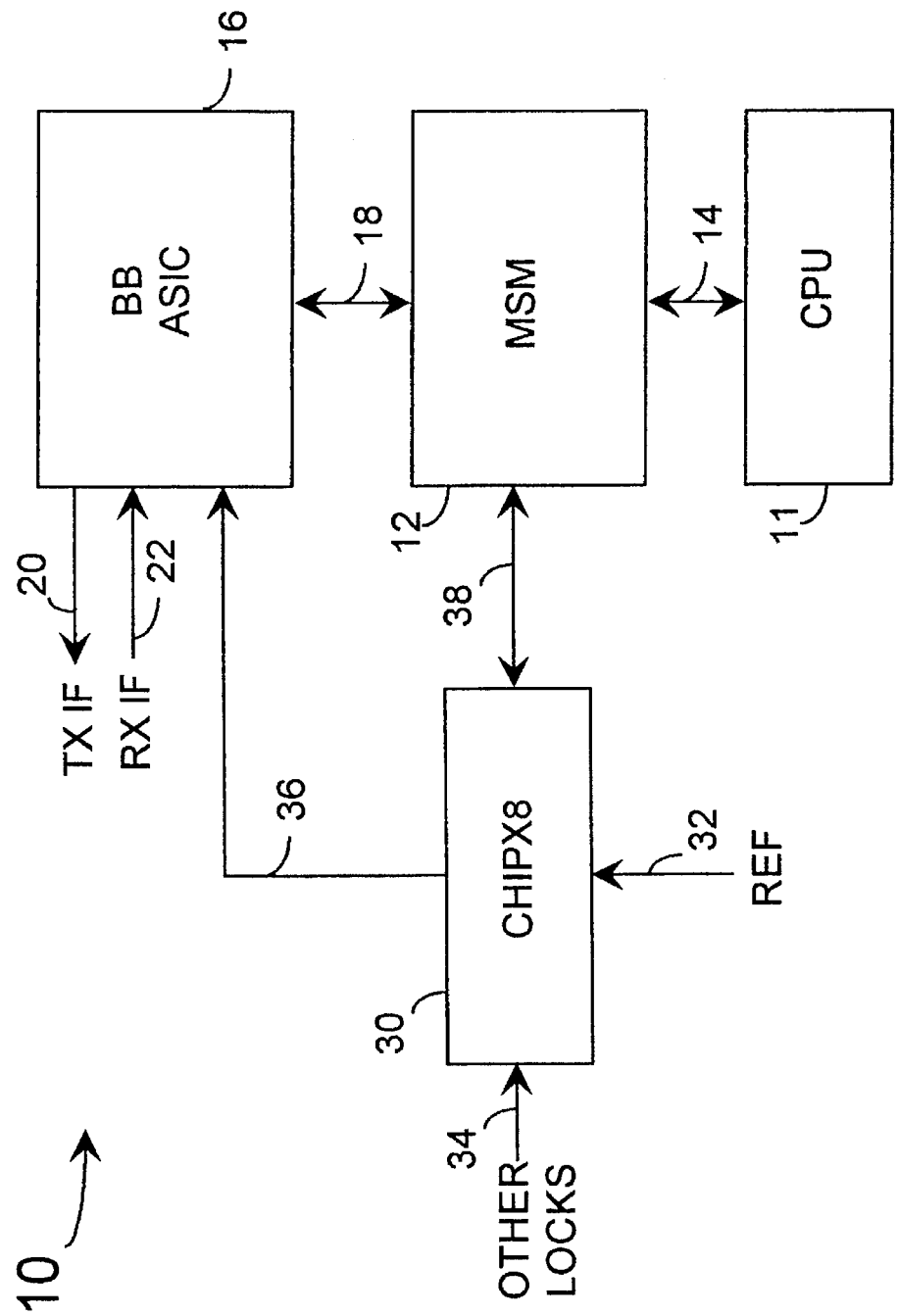
FIG. 1 is a block diagram representation of a portion of a CDMA/FM dual-mode cellular telephone, in accordance with one preferred embodiment of the present invention.

Referring now in greater detail to the drawings, in which like numerals represent like components throughout the several views, FIG. 1 shows a block diagram representation of a portion of a CDMA/FM dual-mode cellular telephone 10, in accordance with one preferred embodiment of the present invention. A central processing unit (CPU) 11 is connected to a mobile station modem (MSM) 12 through CPU/MSM connecting lines 14. The MSM 12 is also connected to a baseband application-specific integrated circuit (BB ASIC) 16 through BB/MSM connecting lines 18. Transmit intermediate frequency (TX IF) lines 20 and receive (RX) IF lines 22 are also connected to the BB ASIC 16 and extend to additional IF and RF circuitry and an antenna (not shown). According to this preferred embodiment, prior art examples of an acceptable CPU 11, MSM 12, and BB ASIC 16 are, respectively, the 80C186 microprocessor available from Advanced Micro Devices of Sunnyvale, Calif., the Q52501-1S2MSM available from Qualcomm, Inc. of San Diego, Calif., and the Q53101-152 baseband ASIC also available from Qualcomm, Inc. In accordance with this preferred embodiment of the present invention, the portion of the CDMA/FM cellular telephone 10 shown in FIG. 1 is only one part of the total cellular telephone which includes a host of other components which, although not shown in any FIGS., would be readily understood by those skilled in the art regarding the operation of, and the need for, such components.

A chip-times-eight (CHIPX8) circuit 30 is shown connected to a reference signal line 32 supplying a reference frequency (one acceptable example being 19.8 MHz), another lock detectors line 34, a PLL output line 36, and PLL/MSM/CPU connection lines 38. The frequency of the signal output along the PLL output line 36 is equal to eight (8) times the spreading rate (or chip rate) of the CDMA modulation, thus the reason for the name of the CHIPX8 circuit 30. The CHIPX8 frequency, one acceptable example being 9.8304 MHz, is used by the BB ASIC 16 for analog-to-digital conversions and, as a result of being passed through one of the BB/MSM connection lines 18, by the MSM 12 for internal clocking and modulating CDMA signals. Internal switching within the BB ASIC 16 prevents the frequency from reaching the MSM 12 during sleep mode for power conservation, as would be understood by one reasonably skilled in the art. The PLL/MSM/CPU connection lines 38, identified in more detail below, transfer signals between the CHIPX8 circuit 30 and general purpose input/output (I/O) ports on the MSM 12 for indirect communication with the CPU 11.

Figure 2:
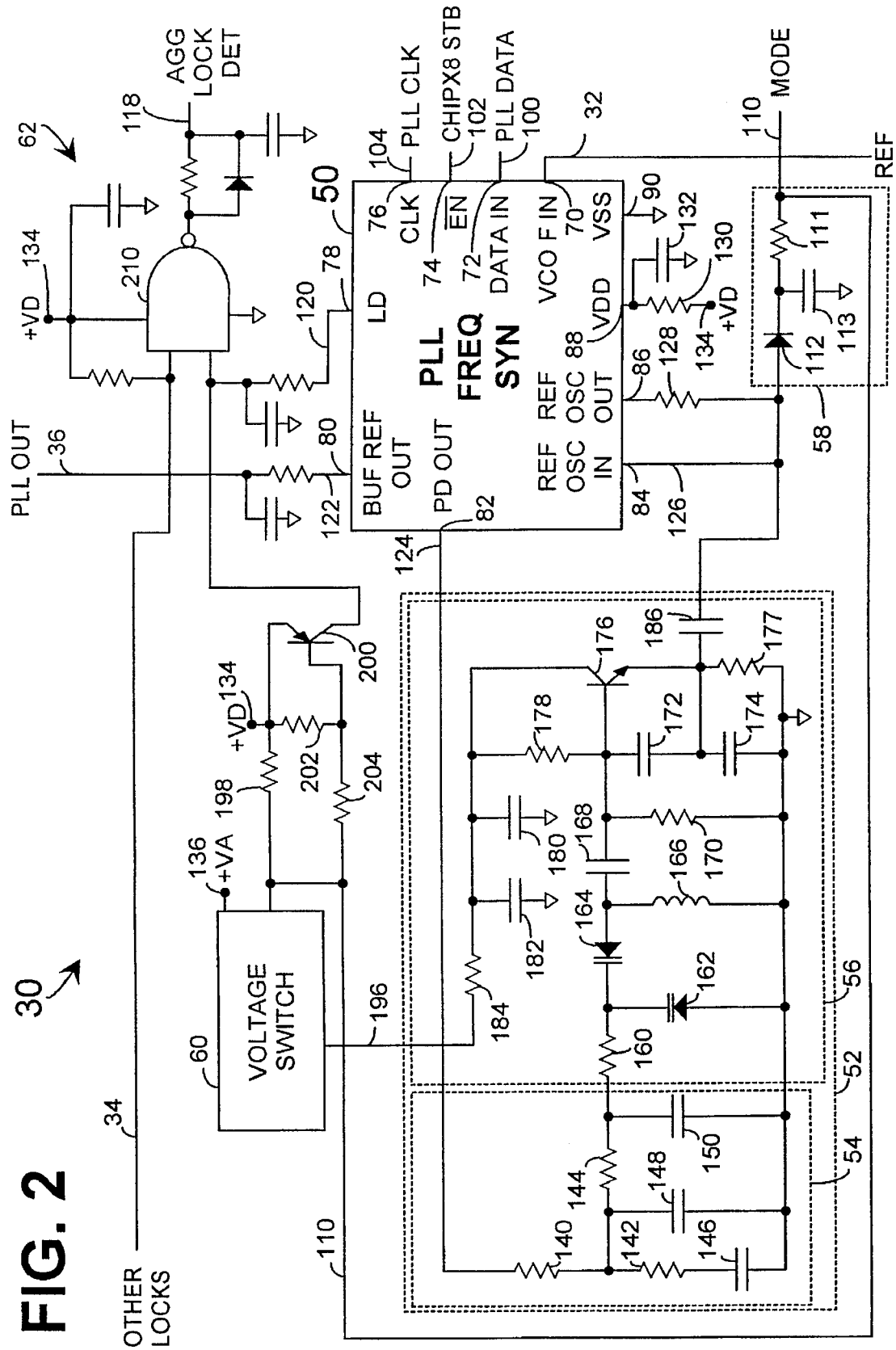
FIG. 2 is a schematic representation of the CHIPX8 circuit of FIG. 1.

Refer now to FIG. 2, which shows a schematic representation of the CHIPX8 circuit 30 of FIG. 1. A PLL frequency synthesizer 50 is coupled to a controlled oscillator loop 52 (indicated and subdivided in dotted lines) including a loop filter 54 and a VCO 56. Together, the PLL frequency synthesizer 50 and the controlled oscillator loop 52 form a phase-locked loop. A selective grounding network 58, a voltage switch 60, and a lock detect network 62 compose the remainder of the CHIPX8 circuit 30.

One example of an acceptable prior art PLL frequency synthesizer 50 is the MC145170 integrated circuit available from Motorola, Inc. of Schaumburg, Ill. The PLL frequency synthesizer 50 includes a variety of conventional inputs and outputs. The nouns "input" and "output" often refer herein to circuital points, such as an IC pin or a point along a conductor or trace within a circuit, serving as a location where signals of a designated type enter or exit, or typically enter or exit, a circuital element or grouping. The PLL frequency synthesizer 50 is shown including a VCO input 70, a data input 72, an enable input 74, a data clock input 76, a lock detector output 78, a buffered reference output 80, a phase detector output 82, a reference oscillator input 84, a reference oscillator output 86, a power input 88, and a ground input 90. The VCO input 70 of the PLL frequency synthesizer 50 (often labeled "$f_{in}$" or referred to as a "loop input") is typically where signals from a VCO are directed into the PLL frequency synthesizer 50. However, according to the present invention, the reference signal line 32 directs reference signals into the VCO input 70. In this preferred embodiment, the reference frequency of the reference signal on the signal line 32 is generated by a voltage-controlled, temperature-compensated crystal oscillator (not shown) which outputs a signal which is amplified and sharpened into a square wave by an isolating digital buffer (not shown) biased in a linear mode. One example of an acceptable reference frequency is 19.8 MHz.

The data input 72, enable input 74, and data clock input 76 are shown connected, respectively, to a PLL data line 100, a CHIPX8 strobe line 102, and a PLL data clock line 104. Lines 100, 102, and 104 are part of the PLL/MSM/CPU connecting lines 38 (FIG. 1) discussed above. Also included in the PLL/MSM/CPU connecting lines 38 is a mode line 110 which toggles between being high for CDMA mode and low for FM mode. The mode line 110 is shown connected to the selective grounding network 58 which includes a resistor 111, a diode 112, and a capacitor 113. Another line included in the PLL/MSM/CPU connecting lines 38 is an aggregate lock detect line 118 shown connected to the lock detect circuitry 62. The lock detector output 78 of the PLL frequency synthesizer 50 is connected to a lock detector line 120 feeding into the lock detect circuitry 62. The buffered reference output 80 is connected to a reference output line 122 which is noise filtered before exiting the CHIPX8 circuit 30 as the PLL output line 36. The phase detector output 82 is connected to a phase detector output line 124 carrying signals to the controlled oscillator loop 52.

While the reference oscillator input 84 of the PLL frequency synthesizer 50 would typically be connected to a reference signal of some type, such as a crystal oscillator or an external clock source, a VCO output line 126 is connected to the reference oscillator input 84 in this embodiment of the present invention. Similarly, the reference oscillator output 86 would normally be connected to a crystal oscillator or nothing at all, yet in this preferred embodiment of the present invention, the reference oscillator output 86 of the PLL frequency synthesizer 50 is connected through a resistor 128 to the VCO output line 126. Finally, the VDD input 88 is connected across a resistor 130 to a digital voltage source 134 (+VD) and to a capacitor 132. The digital voltage source 134 is similar in amount to an analog voltage source 136 (+VA) connected to the voltage switch 60 but is isolated therefrom to reduce noise.

The loop filter 54 of the controlled oscillator loop 52 receives the phase detector output line 124 from the phase detector output 82. Comprised of resistors 140, 142, and 144 and capacitors 146, 148, and 150, the loop filter 54 provides lowpass filtering to the phase detector output line 124 so that a clean direct current (DC) signal arrives at the VCO 56. Inside the VCO 56, an isolating resistor 160 is connected to a pair of varactor diodes 162 and 164 which provide variable capacitances based on the voltage of the DC signal supplied from the loop filter 54. An inductor 166 is shown connected to a capacitor 168 which is connected to a resistor 170, two capacitors 172, 174 and a transistor amplifier 176. The capacitive and inductive abilities of the VCO 56 function as an LC tank to create an oscillation which is sustained by the transistor amplifier 176. Additional biasing, noise-control, and isolation components of the VCO 56 include resistors 177, 178 and 184 and capacitors 180, 182, and 186.

Through resistor 184, the VCO 56 is connected to a selective CDMA power line 196 connected to the voltage switch 60. According to one aspect of this preferred embodiment of the present invention, when the mode line 110, which is otherwise pulled up through resistor 198, is low, the voltage switch 60 removes power to the selective CDMA power line 196 to turn off the VCO 56 to conserve power during the FM mode when the VCO 56 is not used. At the same time, the mode line 110 pulls down the VCO output line 126, thus also effectively grounding the reference oscillator input 84 of the PLL frequency synthesizer 50. Otherwise, because of the linearly biasing resistor 128, the reference oscillator input 84 would tend to reach an equilibrium voltage which would still cause the PLL frequency synthesizer 50 to drain more current. Also, the mode line 110 activates a transistor 200 through resistors 204 and 202 to produce a false lock detector signal into a digital NAND gate 210 which would otherwise combine signals on the lock detector output line 120 with signals on the other lock detectors line 34. Operationally, lock detect circuitry 62 provides a signal on the aggregate lock detect line 118 which is low unless one of the associated PLL circuits, such as the CHIPX8 circuit 30, pulses low to indicate a lock loss, at which time the lock detect circuitry 62 will capacitively hold the aggregate lock detect line 118 high for a period of time necessary to be noticed by the CPU 11 (FIG. 1). Therefore, while in the FM mode of operation, it is necessary to provide a false lock signal through the transistor 200 to avoid masking the working condition of other PLL's represented by the other lock detectors line 34 which are in use during the FM mode.

Figure 3:
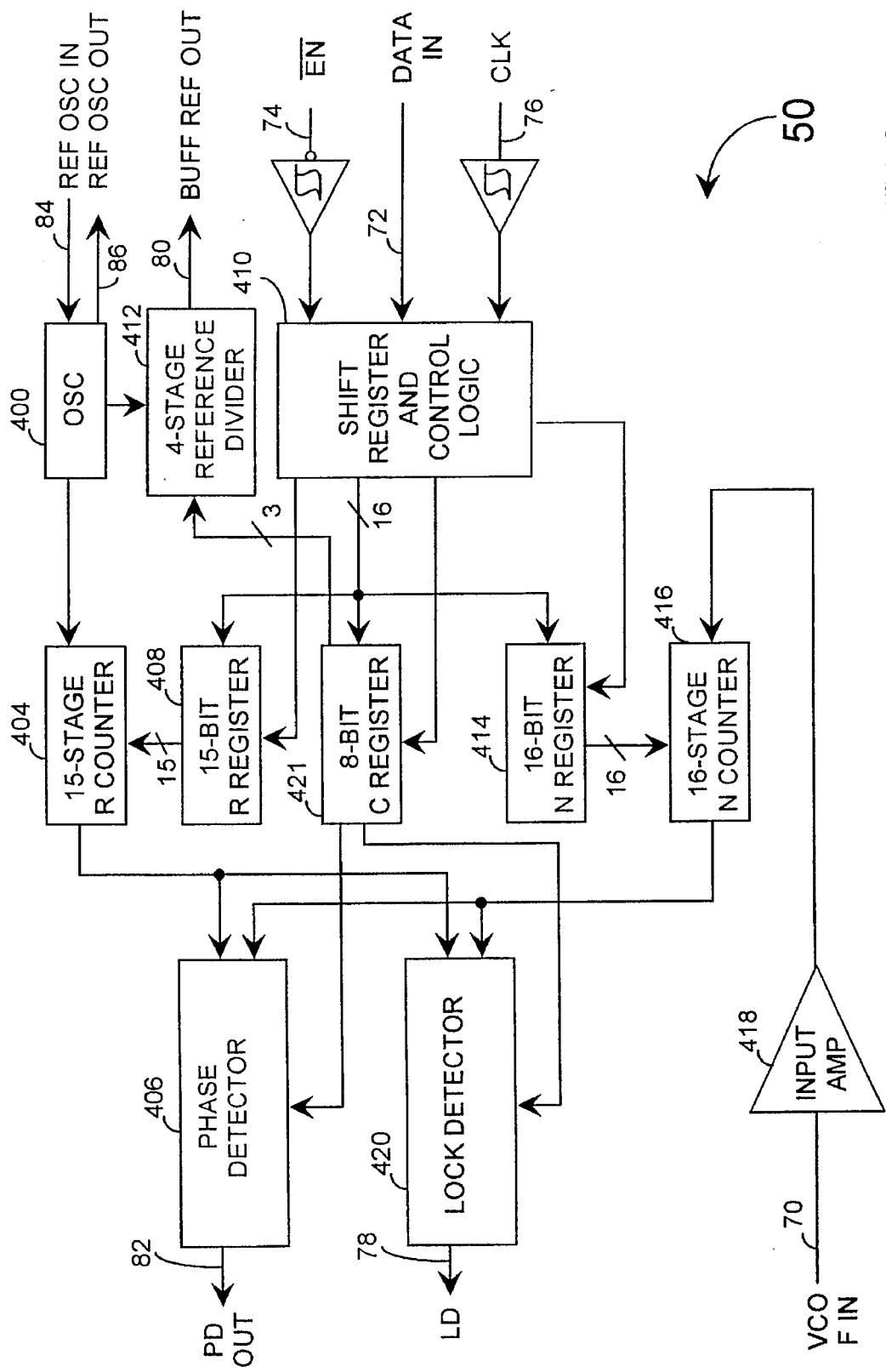
FIG. 3 is a block diagram representation of the PLL frequency synthesizer of FIG. 2.

Refer now to FIG. 3 which shows a block diagram representation of the PLL frequency synthesizer 50 of FIG. 2. For clarity of explanation, the inputs and outputs of the PLL frequency synthesizer 50 are visually shown different to that shown in FIG. 2, and the VDD and VSS inputs are not shown in FIG. 3. As a signal is received frown the VCO 56 (FIG. 2) on the reference oscillator input 84, the oscillator block 400 (essentially equivalent to a CMOS inverter in the example given) supplies the signal to a 15-stage counter 404 which, as determine by a 15-bit register 408, divides the frequency of the signal down to an internal frequency, such as 4.8 kHz before being supplied to a phase detector 406 and a lock detector 420. The oscillator 400 also supplies an inverted version of the signal from the reference oscillator input 84 back out the reference oscillator output 86 and to a 4-stage reference divider 412 which buffers the signal before outputting the signal through the buffered reference output 80. Configuration data enters a shift register and control logic portion 410 of the PLL frequency synthesizer 50 from the CPU 11 (FIG. 1) through the data input 72, as clocked by the data clock input 76 and enabled by the enable line 74. One data element controls the divide ratio of the 4-stage reference divider 412. According to the present invention, no division is performed so that the frequency of the signal entering the 4-stage reference divider 412 is the same as the frequency of the signal on the buffered reference output 80.

Similarly, according to the reverse arrangement of the preferred embodiment of the present invention, signals from the reference signal line 32 (FIG. 2) enter through the VCO input 70. After being amplified by an input amplifier 418, the frequency of that signal is divided down to the same internal frequency (such as 4.8 kHz) by a 16-stage counter 416 as determined by a 16-bit register 414. The shift register and control logic portion 410 passes the appropriate values into the registers 408, 414 to equate the frequencies which exit the counters 404, 416, and an 8-bit register 421 is used to pass data to the 4-stage reference divider 412, the phase detector 406, and the lock detector 420. The phase detector 406 compares the two frequencies and outputs through the phase detector output 82 a signal which is either low or high until the frequencies are similar, and then adjusts upward or downward to effect a phase adjustment, until settling at a point where the frequencies and phases match. According to the preferred embodiment of the present invention, data is entered into the shift register and control portion 410 which inverts the phase detector output 82 in view of the reversed configuration. As usual, the lock detector 420 outputs a high signal on the lock detector output 78 to indicate a frequency/phase locked condition, pulsing low when there is no lock.

While the embodiments of the present invention which have been disclosed herein are the preferred forms, other embodiments of the present invention will suggest themselves to persons skilled in the art in view of this disclosure. Therefore, it will be understood that variations and modifications can be effected within the spirit and scope of the invention and that the scope of the present invention should only be limited by the claims below. Furthermore, the equivalents of all means-or-step-plus-function elements in the claims below are intended to include any structure, material, or acts for performing the function as specifically claimed and as would be understood by persons skilled in the art of this disclosure.

I claim:

1. A phase-locked loop circuit comprising:

means responsive to a control signal for oscillating to produce a loop signal at a first frequency with a phase controlled by the control signal, means coupled to said oscillating means responsive to the loop signal and a reference signal for both generating the control signal and buffering the loop signal to produce a controlled buffered output signal, and means for selectively reducing power consumption of said phase-locked loop circuit.

2. The circuit of claim 1, wherein said power reducing means is coupled to said generating buffering means.

3. The circuit of claim 1, wherein said power reducing means is coupled to said oscillating means.

4. The circuit of claim 1, wherein said power reducing means includes a selective grounding network coupled to said generating buffering means, and a switch for removing power to said oscillating means, said switch coupled to said selective grounding network.

5. The circuit of claim 1, wherein said power reducing means is responsive to a mode select signal in a dual mode telephone.

6. The circuit of claim 1,
wherein said oscillating means includes
means coupled to said generating buffering means for filtering the control signal received from said generating buffering means, said filtering means including a low pass filter, and
means coupled to said filtering means for controllably oscillating at a frequency determined by a voltage from said filtering means, said controllably oscillating means including a voltage-controlled oscillator responsive to the control signal; and
wherein said generating buffering means, contained in a single integrated circuit, includes
means for detecting phase differences between the reference signal and the loop signal, and
means for buffering the loop signal.

7. The circuit of claim 6, wherein said generating buffering means includes a phase-locked loop frequency synthesizer including
an internal buffer,
means for receiving and storing configuration data,
means for saving the configuration data when said power reducing means reduces power consumption, means for generating, responsive to the configuration data, the control signal,
means for dividing the loop signal down to a divided loop signal,
means for dividing the reference signal down to a divided reference signal,
means for detecting phase differences between the divided loop signal and the divided reference signal,
means for generating the control signal based upon phase differences between the divided loop signal and the divided reference signal,
means for detecting phase equivalence between the divided loop signal and the divided reference signal, and means for generating a lock detect signal.

8. The circuit of claim 7, wherein said generating buffering means further includes
means for generating the lock detect signal responsive to detecting phase equivalence between the divided loop signal and the divided reference signal, and
means responsive to operation of said power reducing means for generating a false lock detect signal as a substitute for the lock detect signal.

9. The circuit of claim 8, wherein the false lock detect signal occurs in a frequency modulation (FM) mode in a code division multiple access/frequency modulation (CDMA/FM) dual mode cellular telephone.

10. A phase-locked loop circuit comprising:
means responsive to a control signal for oscillating to produce a loop signal at a first frequency with a phase controlled by the control signal; and
means coupled to said oscillating means responsive to the loop signal and a reference signal for, in single, separate integrated circuit, both generating the control signal and buffering the loop signal to produce a controlled buffered output signal.

11. The circuit of claim 10, wherein the loop signal and the reference signal follow different electrical signal paths.

12. The circuit of claim 10,
wherein said oscillating means includes
means coupled to said generating buffering means for filtering the control signal received from said generating buffering means, said filtering means including a low pass filter, and
means coupled to said filtering means for controllably oscillating at a frequency determined by a voltage from said filtering means, said controllably oscillating means including a voltage-controlled oscillator responsive to the control signal; and
wherein said generating buffering means includes
means for detecting phase differences between the reference signal and the loop signal, and
means for buffering the loop signal.

13. The circuit of claim 10, further comprising means for selectively reducing power consumption of said phase-locked loop circuit, wherein said power reducing means includes
a selective grounding network coupled to said generating buffering means, and
a switch for removing power to said oscillating means, said switch coupled to said selective grounding network.

14. The circuit of claim 13, wherein said power reducing means is responsive to a mode select signal in a dual mode telephone.

15. The circuit of claim 13,
wherein said oscillating means includes a low pass filter coupled to a voltage-controlled oscillator responsive to a voltage level of the control signal, and
wherein said generating buffering means includes a phase-locked loop frequency synthesizer including:
an internal buffer,
means for receiving and storing configuration data,
means for generating, responsive to the configuration data, the control signal,
means for saving the configuration data when said power reducing means reduces the power consumption,
means for dividing the loop signal down to a divided loop signal,
means for dividing the reference signal down to a divided reference signal,
means for detecting phase differences between the divided loop signal and the divided reference signal,
means for generating the control signal based upon phase differences between the divided loop signal and the divided reference signal,
means for detecting a phase equivalence between the divided loop signal and the divided reference signal, and
means for generating a lock detect signal.

16. The circuit of claim 13, wherein said generating buffering means further includes
means for generating a lock detect signal responsive to detecting phase equivalence between the divided loop signal and the divided reference signal, and
means responsive to operation of said power reducing means for generating a false lock detect signal as a substitute for the lock detect signal.

17. The circuit of claim 16, wherein the false lock detect signal occurs in a frequency modulation (FM) mode in a code division multiple access/frequency modulation (CDMA/FM) dual mode cellular telephone.

18. A phase-locked loop circuit for receiving as input a reference signal at a reference frequency over a reference signal line and producing as output a buffered controlled output signal at a controlled output frequency on a controlled output signal line, said circuit comprising:

a buffered phase detector device contained in a single, separate integrated circuit, said buffered phase detector device including:

a phase detector including a first phase detector input coupled to said reference signal line, a second phase detector input coupled to a controlled oscillator output line, and a phase detector output coupled to a controlled oscillator control line, and a buffer including a buffer input coupled to said second phase detector input, and a buffer output coupled to said controlled output signal line; and a controlled oscillator loop disposed in electrical continuity between said controlled oscillator control line and said controlled oscillator output line.

19. The circuit of claim 18, wherein said controlled oscillator loop includes a low pass loop filter and a voltage-controlled oscillator.

20. The circuit of claim 18, further comprising power consumption reduction circuitry including means for selectively grounding said controlled oscillator output line.

21. The circuit of claim 20, wherein said phase-locked loop circuit is in a code division multiple access/frequency modulation (CDMA/FM) dual mode cellular telephone, and said power consumption reduction circuitry reduces power consumption in the frequency modulation (FM) mode.

22. The circuit of claim 20, wherein said buffered phase detector device includes means for receiving and storing input configuration data, said buffered phase detector device retains input configuration data when said power consumption reduction circuitry reduces power consumption.

23. The circuit of claim 18, wherein said buffered phase detector device further includes said second phase detector input disposed in electrical continuity between said controlled oscillator output line and said controlled oscillator control line, a first counter disposed in electrical continuity between said reference signal line and said first phase detector input, a second counter disposed in electrical continuity between said controlled oscillator output line and said second phase detector input, counter configuration memory elements, and a lock detector coupled to said first counter and said second counter.

24. The circuit of claim 18, wherein said buffer is a conventional reference signal buffer.

25. The circuit of claim 18, wherein said buffered phase detector device includes a multi-stage reference divider configured to divide by one.

\* \* \* \* \*